United States Patent
Ichikawa (10) Patent No.: US 12,224,320 B2
(45) Date of Patent: Feb. 11, 2025

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Yoshihito Ichikawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 229 days.

(21) Appl. No.: 17/587,802

(22) Filed: Jan. 28, 2022

(65) Prior Publication Data

US 2022/0285501 A1    Sep. 8, 2022

(30) Foreign Application Priority Data

Mar. 5, 2021 (JP) ................. 2021-035840

(51) Int. Cl.
*H01L 29/16* (2006.01)
*H01L 29/66* (2006.01)
*H01L 29/78* (2006.01)

(52) U.S. Cl.
CPC .... *H01L 29/1608* (2013.01); *H01L 29/66734* (2013.01); *H01L 29/7811* (2013.01); *H01L 29/7813* (2013.01)

(58) Field of Classification Search
None
See application file for complete search history.

(56) References Cited

U.S. PATENT DOCUMENTS

2012/0267681 A1   10/2012   Nemoto et al.
2019/0252503 A1   8/2019    Uehigashi
(Continued)

FOREIGN PATENT DOCUMENTS

JP    2007-266233 A    10/2007
JP    2008135439 A      6/2008
(Continued)

OTHER PUBLICATIONS

Japanese Office Action dated Nov. 26, 2024, in the counterpart Japanese Patent Application No. 2021-035840.

*Primary Examiner* — Jack S Chen
(74) *Attorney, Agent, or Firm* — Rabin & Berdo, P.C.

(57) ABSTRACT

At any timing after formation of gate electrodes, particle beam irradiation is performed to a semiconductor wafer having an $n^-$-type drift region constituted by an $n^-$-type epitaxial layer and having an n-type impurity concentration that is higher than a target majority carrier concentration (design value) of the $n^-$-type drift region. Point defects of a defect density corresponding to an irradiation dose of the particle beam are generated in the $n^-$-type drift region by the particle beam irradiation, whereby an effective majority carrier concentration of the $n^-$-type drift region is adjusted and reduced with respect to the n-type impurity concentration of the $n^-$-type drift region, to approach the design value. After formation of the $n^-$-type epitaxial layer, the n-type impurity concentration of the $n^-$-type drift region may be measured, or the $n^-$-type epitaxial layer may be formed to have an n-type impurity concentration higher than the design value.

20 Claims, 7 Drawing Sheets

(56) References Cited

U.S. PATENT DOCUMENTS

2020/0194562 A1    6/2020  Yoshimura et al.
2022/0285501 A1*   9/2022  Ichikawa ............ H01L 29/0878

FOREIGN PATENT DOCUMENTS

| JP | 5569532 B2 | 8/2014 |
| JP | 2019-080035 A | 5/2019 |
| JP | 2019-140242 A | 8/2019 |
| WO | 2019181852 A1 | 9/2019 |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-035840, filed on Mar. 5, 2021, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, in a silicon carbide semiconductor device containing silicon carbide (SiC) as a semiconductor material, a drift region is epitaxially grown doped with an impurity (dopant) of a predetermined conductivity type. A method of manufacturing a conventional silicon carbide semiconductor device is described taking, as an example, an instance in which an n-channel-type vertical metal oxide semiconductor field effect transistor (MOSFET) having insulated gates with a 3-layer structure including a metal, an oxide film, and a semiconductor is fabricated.

Figure 8:
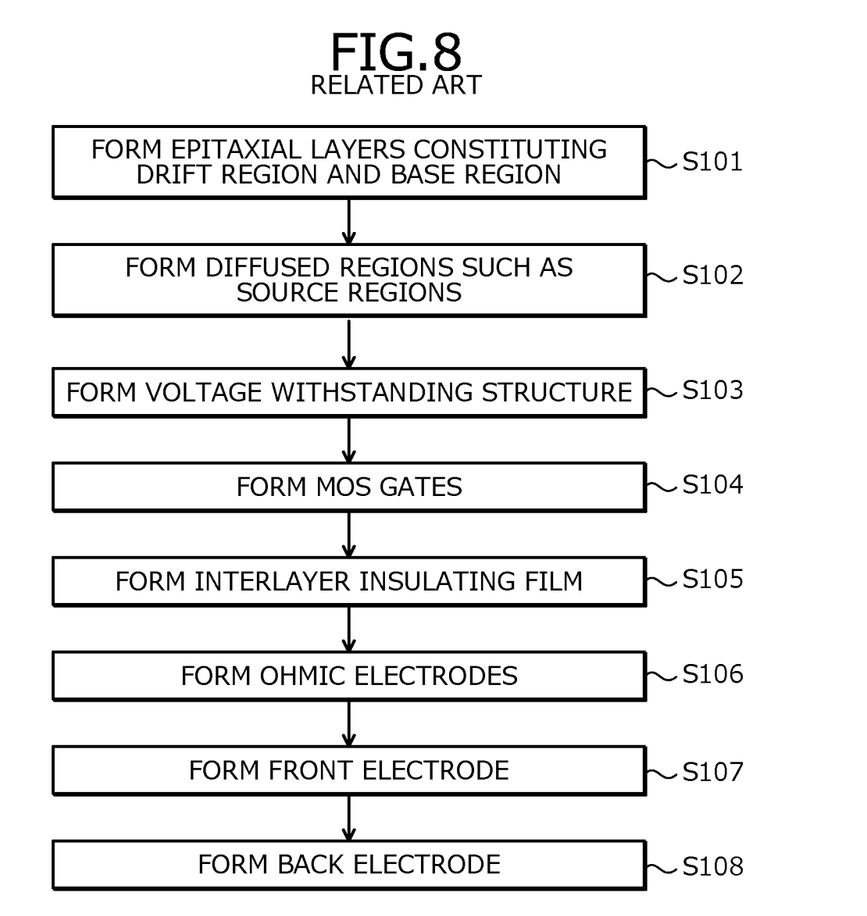
FIG. 8 is a flowchart of an outline of a method of manufacturing a conventional silicon carbide semiconductor device.

FIG. 8 is a flowchart of an outline of the method of manufacturing a conventional silicon carbide semiconductor device. First, an $n^+$-type starting wafer constituting an $n^+$-type drain region is prepared. Next, epitaxial layers constituting an $n^-$-type drift region and a p-type base region are sequentially formed on the $n^+$-type starting wafer by epitaxial growth (step S101). By the processes up to here, a semiconductor wafer having a front surface that is a surface of a p-type epitaxial layer constituting the p-type base region and a back surface that is a surface of the $n^+$-type starting wafer is completed.

Next, in respective active regions of individual chip regions of the semiconductor wafer, predetermined diffused regions such as $n^+$-type source regions and $p^{++}$-type contact regions are formed by ion implantation (step S102). Next, in each of the individual chip regions of the semiconductor wafer, in an edge termination region thereof surrounding a periphery of the active region, a predetermined voltage withstanding structure is formed (step S103). Next, MOS gates (insulated gates each having a 3-layer structure including a metal, an oxide film, and a semiconductor) are formed (step S104). Next, an interlayer insulating film is formed on the front surface of the semiconductor wafer (step S105).

Next, the interlayer insulating film is selectively removed, whereby contact holes exposing the $n^+$-type source regions and the $p^{++}$-type contact regions are formed. Next, ohmic electrodes in ohmic contact with the semiconductor wafer are formed in the contact holes of the interlayer insulating film (step S106). Next, a front electrode and a back electrode are formed on the main surfaces of the semiconductor wafer, respectively (steps S107, S108). Thereafter, the semiconductor wafer is cut (diced) into individual semiconductor chips, whereby the conventional silicon carbide semiconductor device is completed.

In the process at step S101, a temperature of the epitaxial growth of the epitaxial layers is a high temperature of about 1600 degrees C. Therefore, variation of majority carrier (donor) concentration of the $n^-$-type drift region increases. For example, the majority carrier concentration of the $n^-$-type drift region that is doped with nitrogen (N) and formed by epitaxial growth varies about ±5% from a target majority carrier concentration (design value) at a surface of a semiconductor chip (a semiconductor substrate configuring the silicon carbide semiconductor device) and varies about ±10% from a target majority carrier concentration (design value) at the surface of the semiconductor wafer.

Accordingly, the majority carrier concentration of the $n^-$-type drift region varies about ±15% from the majority carrier concentration targeted between semiconductor chips cut from a single semiconductor wafer. On the other hand, in an instance in which silicon (Si) is used as a semiconductor material, the temperature of the epitaxial growth is low compared to the instance in which silicon carbide is used as a semiconductor material. Therefore, in the $n^-$-type drift region that is doped with nitrogen and formed by epitaxial growth, variation of the majority carrier concentration from the majority carrier concentration targeted between the semiconductor chips cut from the same semiconductor wafer is small at about ±7%.

As a conventional silicon carbide semiconductor device, a MOSFET has been proposed in which an $n^-$-type drift region is configured by an $n^-$-type epitaxial layer for which a lifetime of holes that become minority carriers is set to be at most 1 μsec (for example, refer to Japanese Laid-Open Patent Publication No. 2019-140242 and Japanese Laid-Open Patent Publication No. 2019-080035). In Japanese Laid-Open Patent Publication No. 2019-140242 and Japanese Laid-Open Patent Publication No. 2019-080035, after formation of diffused regions by ion implantation but before formation of gate trenches, annealing at a temperature of at least 1700 degrees C. or irradiation of an electron beam or a positron beam or irradiation of helium ions ($He^+$) and annealing is performed, thereby reducing the lifetime of the minority carriers of the $n^-$-type drift region.

As a conventional semiconductor device using silicon as a semiconductor material, a device has been proposed in which in an $n^-$ drift region, a proton buffer structure is formed by proton ($H^+$) irradiation and annealing (for example, refer to Japanese Patent No. 5569532). In Japanese Patent No. 5569532, a broad buffer region having a net-doping concentration distribution that decreases toward both main surfaces of the semiconductor substrate, from a depth position where a net-doping concentration is greatest in an $n^-$ drift region is provided, whereby variation of resistivity of the $n^-$ drift region is reduced.

As another conventional semiconductor device using silicon as a semiconductor material, a device has been proposed in which in an $n^-$ drift region, hydrogen is introduced by proton irradiation in an entire area of the $n^-$ drift region in a depth direction (for example, refer to Japanese Laid-Open Patent Publication No. 2007-266233). In Japanese Laid-Open Patent Publication No. 2007-266233, hydrogen is introduced in an entire area of the drift region in the depth direction, thereby making the hydrogen concentration of the drift region higher than a donor concentration of the $n^-$ drift region, whereby the majority carrier concentration of the $n^-$ drift region is increased, the resistivity of the $n^-$ drift region is adjusted, and high breakdown voltage is realized.

SUMMARY OF THE INVENTION

According to an embodiment of the present invention, a silicon carbide semiconductor device includes: a starting substrate containing silicon carbide and having a first surface and a second surface opposite to each other; a first-conductivity-type epitaxial layer provided on the first surface of the starting substrate; a second-conductivity-type epitaxial layer provided on the first-conductivity-type epitaxial layer; and a pn junction through which a main current passes, the pn junction being between the second-conductivity-type epitaxial layer and the first-conductivity-type epitaxial layer. The first-conductivity-type epitaxial layer contains a plurality of point defects at a defect density corresponding to an irradiation dose of a particle beam, the first-conductivity-type epitaxial layer having an effective majority carrier concentration that is lower than a concentration of a first-conductivity-type impurity of the first-conductivity-type epitaxial layer.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques are discussed. In the method of manufacturing the conventional silicon carbide semiconductor device described above (refer to FIG. 8), while variation of the majority carrier concentration of the epitaxial layer constituting the n$^-$ drift region may be reduced, for example, by the temperature of the epitaxial growth, control of the temperature of the epitaxial growth is limited. Japanese Laid-Open Patent Publication No. 2019-140242, Japanese Laid-Open Patent Publication No. 2019-080035, Japanese Patent No. 5569532, and Japanese Laid-Open Patent Publication No. 2007-266233 do not mention an effective majority carrier concentration of the n$^-$ drift region changing due to particle beam irradiation in an instance in which silicon carbide is used as a semiconductor material.

Variation of the majority carrier concentration of the n$^-$ drift region is related to variation of the ON resistance of the silicon carbide semiconductor device and variation of the breakdown voltage. In particular, for a silicon carbide semiconductor device used under a high temperature environment, adverse effects on the ON resistance thereof due to variation of the majority carrier concentration of the n$^-$ drift region increase. Further, the greater the thickness of the n$^-$ drift region is, the greater are the adverse effects due to variation of the majority carrier concentration of the n$^-$ drift region.

Embodiments of silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
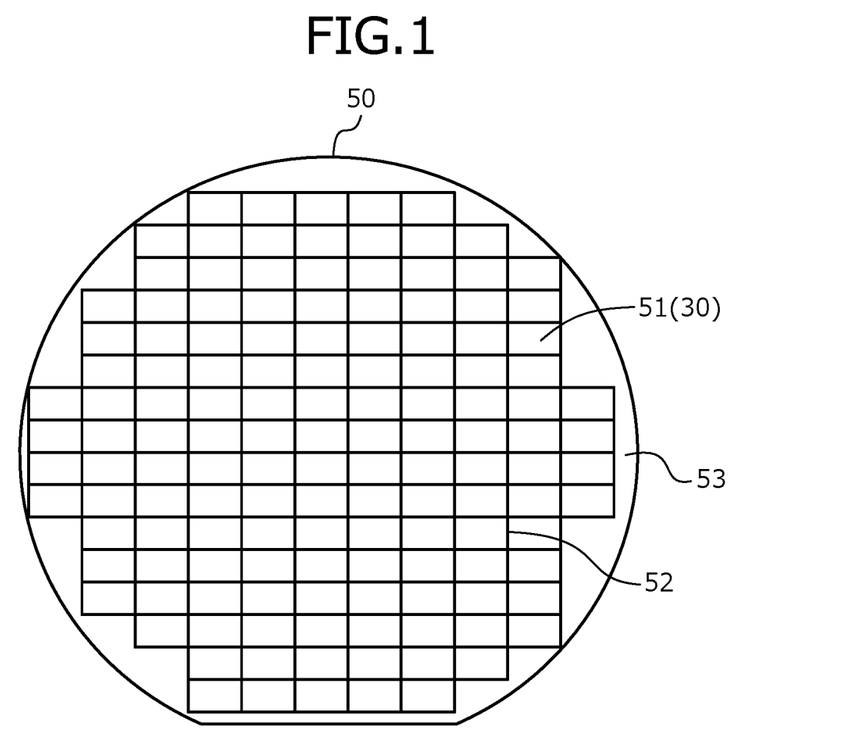
FIG. 1 is a plan view depicting a state when a semiconductor wafer on which a silicon carbide semiconductor device according to an embodiment is manufactured is viewed from a front side thereof.
Figure 2:
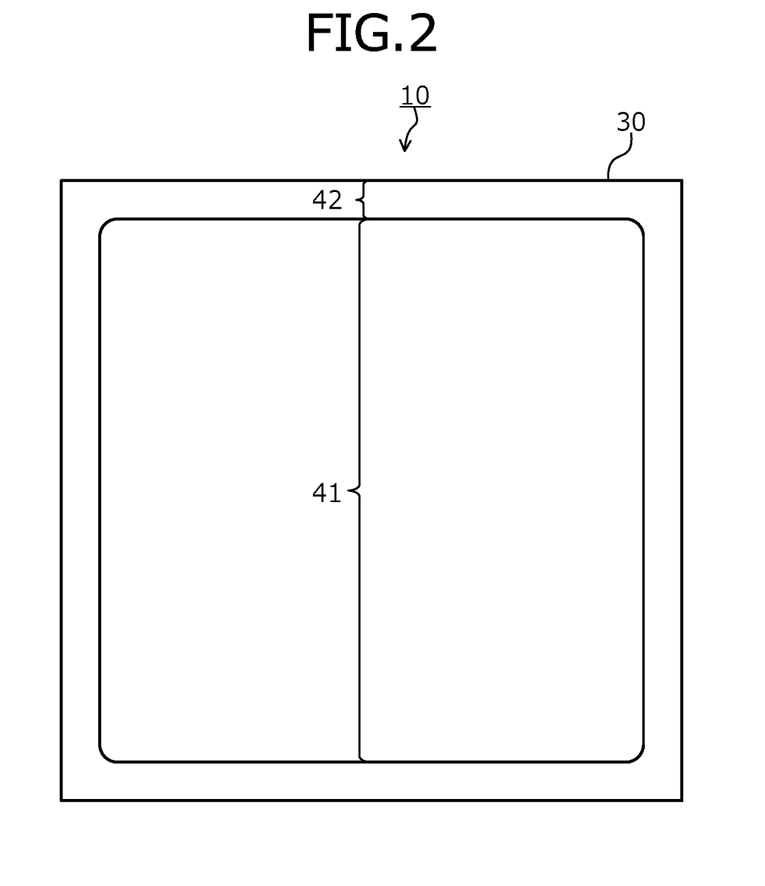
FIG. 2 is a plan view depicting a layout when the silicon carbide semiconductor device according to the embodiment is viewed from a front side of a semiconductor substrate (semiconductor chip).
Figure 3:
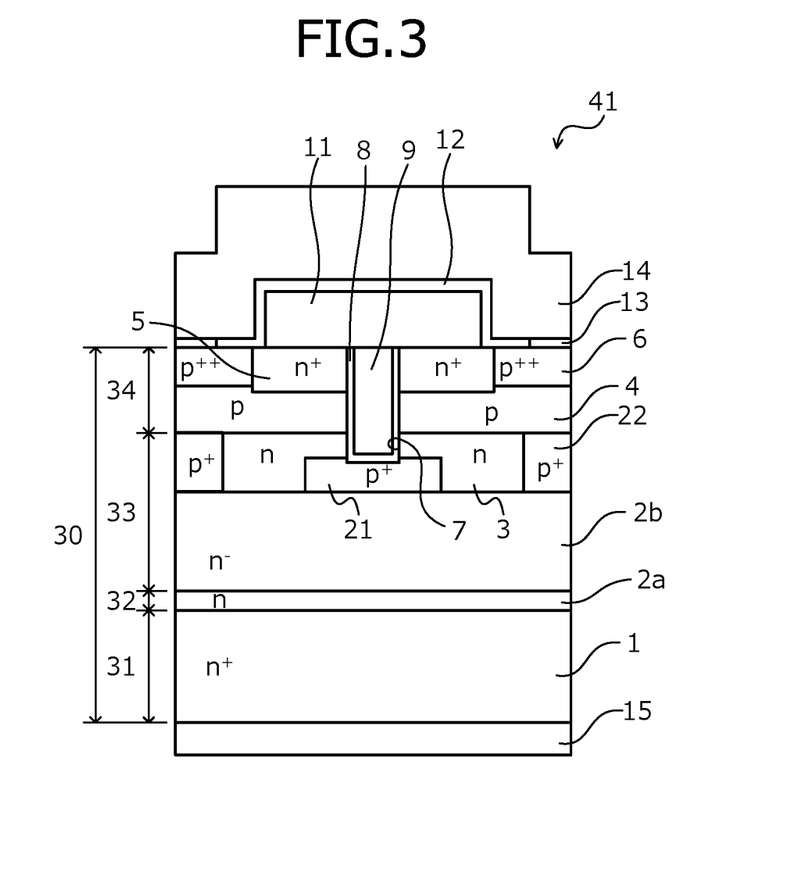
FIG. 3 is a cross-sectional view of an active region in FIG. 2.

A structure of a silicon carbide semiconductor device according to an embodiment is described taking, as an example, an n-channel-type vertical MOSFET having a trench structure. FIG. 1 is a plan view depicting a state when a semiconductor wafer on which the silicon carbide semiconductor device according to the embodiment is manufactured is viewed from a front side thereof. FIG. 2 is a plan view depicting a layout when the silicon carbide semiconductor device according to the embodiment is viewed from a front side of a semiconductor substrate (semiconductor chip). FIG. 2 depicts a state of one chip 51 in FIG. 1 after dicing. FIG. 3 is a cross-sectional view of an active region in FIG. 2.

By a method of manufacturing a later-described silicon carbide semiconductor device 10 according to the embodiment (refer to FIG. 4), the silicon carbide semiconductor device 10 according to the embodiment and depicted in FIGS. 2 and 3 is fabricated (manufactured) on each of the chips 51 (refer to FIG. 1) that are of a substantially center portion of a semiconductor wafer 50 containing silicon carbide (SiC) as a semiconductor material and formed into individual semiconductor substrates (semiconductor chips) 30. Each of the chips 51 is an individual diced (cut) portion of the semiconductor wafer 50 constituting the semiconductor substrate 30 and arranged in the semiconductor wafer 50.

Each of the chips 51 of the semiconductor wafer 50, for example, has a substantially rectangular shape in a plan view; the chips 51 are arranged in a matrix-like pattern in the semiconductor wafer 50 which is cut along dicing lines 52 surrounding each of the chips 51, whereby the chips 51 are obtained. All the semiconductor substrates 30 cut from the single semiconductor wafer 50 have stacked epitaxial layers 32, 33, 34 epitaxially grown by the same processes (refer to FIG. 3) and identical device element structures (here, trench structures, refer to FIG. 3) formed by the same processes.

In particular, the silicon carbide semiconductor device 10 according to the embodiment depicted in FIGS. 2 and 3 is the n-channel-type vertical MOSFET having a trench structure in an active region 41, at a front side of the semiconductor substrate 30 containing silicon carbide. The active region 41 is a region through which a main current (drift current) flows when the MOSFET is ON and in which multiple unit cells (functional units of a device element) having identical MOSFET structures are disposed adjacent to one another. The active region 41, for example, is disposed in substantially a center of the semiconductor substrate 30 and a periphery of the active region 41 is surrounded by an edge termination region 42.

The edge termination region 42 is a region between the active region 41 and ends of the semiconductor substrate 30. The edge termination region 42 has a function of mitigating electric field of the front side of the semiconductor substrate 30 and sustaining a breakdown voltage. In the edge termination region 42, a voltage withstanding structure (not depicted) such as a field limiting ring (FLR), a junction termination extension (JTE:) structure, or a guard ring is disposed. The breakdown voltage is a voltage limit at which no erroneous operation or destruction of the silicon carbide semiconductor device 10 occurs.

The semiconductor substrate 30 is formed by sequentially growing, epitaxially, epitaxial layers 32, 33, 34 constituting an n-type buffer region 2a, an n$^-$-type drift region 2b, and a p-type base region (second-conductivity-type region) 4 on a front surface of an n$^+$-type starting substrate 31 containing silicon carbide. The semiconductor substrate 30 has, as a front surface, a first main surface that is a surface of the p-type epitaxial layer (second-conductivity-type epitaxial layer) 34 and, as a back surface, a second main surface that is a surface of the n$^+$-type starting substrate 31 (back surface of the n$^+$-type starting substrate 31). The n$^+$-type starting substrate 31 is an n$^+$-type drain region 1. The epitaxial layers 32, 33, 34 are epitaxially grown using general epitaxial equipment.

The n-type buffer region 2a has a function of recombining therein holes generated by pn junction interfaces between the p-type base region 4 and the n$^-$-type drift region 2b and thereby prevent the holes from reaching the n$^+$-type starting substrate 31. Further, the n-type buffer region 2a has a function of suppressing growth of stacking faults from the n$^+$-type starting substrate 31 into the epitaxial layers 32, 33, 34. In an instance in which the n-type buffer region 2a is omitted, the n$^-$-type epitaxial layer (first-conductivity-type epitaxial layer) 33 constituting the n$^-$-type drift region 2b is epitaxially grown on the front surface of the n$^+$-type starting substrate 3.

The n$^-$-type drift region 2b contains point defects generated by irradiation of a particle beam such as that containing helium (He), protons (H$^+$), or an electron beam (refer to later-described step S6). An effective majority carrier (donor) concentration of the n$^-$-type drift region 2b is adjusted by this particle beam irradiation to be lower than an n-type impurity concentration of the n$^-$-type drift region 2b. The n-type impurity concentration of the n$^-$-type drift region 2b is a concentration of an n-type impurity (n-type dopant) doped during epitaxial growth of the n$^-$-type epitaxial layer 33.

The effective majority carrier concentration of the n$^-$-type drift region 2b is a concentration of an n-type impurity (donor) that is in an electrically activated state among the n-type impurity (n-type dopant) doped during epitaxial growth of the n$^-$-type epitaxial layer 33. Assuming an instance in which no particle beam irradiation is performed, substantially all of the n-type impurity doped in the n$^-$-type epitaxial layer 33 during the epitaxial growth thereof is electrically activated and therefore, the effective majority carrier concentration of the n$^-$-type drift region 2b is substantially equal to the n-type impurity concentration of the n$^-$-type drift region 2b.

Therefore, in an instance in which no particle beam irradiation is performed, similarly to the conventional method (refer to FIG. 8), the effective majority carrier concentration of the n$^-$-type drift region 2b varies about ±5% from a target majority carrier concentration (design value) at the surface of the semiconductor chip (the semiconductor substrate 30) and varies about ±10% at the surface of the semiconductor wafer 50. Therefore, similarly to the conventional method, the effective majority carrier concentration of the n$^-$-type drift region 2b varies by about ±15% from a target majority carrier concentration between semiconductor chips cut from the same semiconductor wafer 50.

Thus, in the present embodiment, a particle beam irradiation is performed to the semiconductor wafer 50 in which the n-type impurity concentration of the n$^-$-type drift region 2b (the n$^-$-type epitaxial layer 33) is higher than the target majority carrier concentration of the n$^-$-type drift region 2b, whereby the effective carrier concentration of the n$^-$-type drift region 2b is adjusted and reduced. The n$^-$-type drift region 2b contains point defects generated by the particle beam irradiation, at a defect density corresponding to an irradiation dose of the particle beam. While the n-type impurity concentration of the n$^-$-type drift region 2b is not changed by the particle beam irradiation, the effective carrier concentration of the n$^-$-type drift region 2b decreases as the irradiation dose of the particle beam increases.

For example, the effective carrier concentration of the n$^-$-type drift region 2b may be adjusted and reduced by the particle beam irradiation so that variation of the effective carrier concentration of the n$^-$-type drift region 2b (about +10% from the target majority carrier concentration), at the surface of the semiconductor wafer 50, disappears. In this instance, the effective carrier concentration of the n$^-$-type drift region 2b becomes within about 10% lower than the n-type impurity concentration. Therefore, variation of the effective majority carrier concentration of the n$^-$-type drift region 2b may be set to the variation at the surface of the semiconductor chip alone (about +5% from the target majority carrier concentration).

In particular, for example, when the n$^-$-type drift region 2b is irradiated with helium at a dose amount of about $2\times10^{11}/cm^2$, the amount of decrease of the effective majority carrier concentration of the n$^-$-type drift region 2b due to the helium irradiation is about 7% at the surface of the semiconductor wafer 50 (refer to later-described FIG. 5). Therefore, compared to the conventional method (variation of about +15%), variation of the effective majority carrier concentration of the n$^-$-type drift region 2b between the semiconductor chips cut from the same semiconductor wafer 50 may be set to be about +8% (=15%-7%) from the target majority carrier concentration.

For example, when the n$^-$-type drift region 2b is irradiated with protons at a dose amount of about $1\times10^{12}/cm^2$, the amount of decrease of the effective majority carrier concentration of the n$^-$-type drift region 2b due to the proton irradiation is about 6% at the surface of the semiconductor wafer 50 (refer to later-described FIG. 6). Therefore, compared to the conventional method (variation of about +15%), variation of the effective majority carrier concentration of the n$^-$-type drift region 2b between the semiconductor chips cut from the same semiconductor wafer 50 may be set to be about +9% (=15%-6%) from the target majority carrier concentration.

For example, when the n$^-$-type drift region 2b is irradiated with an electron beam at an absorbed dose of about 300 kGy, the amount of decrease of the effective majority carrier concentration of the n$^-$-type drift region 2b due to the electron beam irradiation is about 5% at the surface of the semiconductor wafer 50 (refer to later-described FIG. 7). Therefore, compared to the conventional method (variation of about +15%), variation of the effective majority carrier concentration of the n⁻-type drift region 2b between the semiconductor chips cut from the same semiconductor wafer 50 may be set to be about +10% (=15%−5%) from the target majority carrier concentration.

While the effective majority carrier concentration of the n⁻-type drift region 2b may be reduced a greater extent the greater is the irradiation dose of the particle beam (dose amount of the helium irradiation, dose amount of the proton irradiation, absorbed dose of electron beam irradiation), point defects in the n⁻-type drift region 2b increase. As a result, electrical resistance of the n⁻-type drift region 2b increases, whereby ON resistance of the silicon carbide semiconductor device 10 increases. Therefore, the irradiation dose of the particle beam suffices to be set suitably so that the effective majority carrier concentration of the n⁻-type drift region 2b is not reduced excessively.

In particular, the effective majority carrier concentration of the n⁻-type drift region 2b suffices to be, for example, at least about 70% but less than 100% of the n-type impurity concentration of the n⁻-type drift region 2b. As a result, variation of the effective majority carrier concentration of the n⁻-type drift region 2b may be suppressed so that the amount of excess from the target majority carrier concentration is less than +15%, which is less than that by the conventional method, and the amount of decrease from the target majority carrier concentration may be suppressed within about −15% similarly to the conventional method, thereby enabling suppression of increases in the ON resistance and effects due to the particle beam irradiation to be balanced.

The n⁻-type drift region 2b is provided between and is in contact with the p-type base region 4 and the n-type buffer region 2a. In an instance in which later-described n-type current diffusion regions 3 and first and second p⁺-type regions 21, 22 are provided in the n⁻-type epitaxial layer 33, the n⁻-type drift region 2b is a portion of the n⁻-type epitaxial layer 33 free of the n-type current diffusion regions 3 and the first and the second p⁺-type regions 21, 22, provided between and in contact with the n-type buffer region 2a and the n-type current diffusion regions 3, the first and the second p⁺-type regions 21, 22.

The p-type base region 4 is a portion of the p-type epitaxial layer 34 free of later-described n⁺⁺-type source regions (first-conductivity-type regions) 5 and later-described p⁺⁺-type contact regions 6. The p-type base region 4 is provided between the front surface of the semiconductor substrate 30 and the n⁻-type drift region 2b. The n-type current diffusion regions 3 constituting a so-called current spreading layer (CSL) that reduces carrier spreading resistance may be provided between and in contact with the n⁻-type drift region 2b and the p-type base region 4.

The n-type current diffusion regions 3 reach deep positions closer to the n⁺-type drain region 1 than are bottoms of later-described trenches 7. The n-type current diffusion regions 3 are diffused regions formed in the n⁻-type epitaxial layer 33 by ion implantation. In an instance in which the n-type current diffusion regions 3 are constituted by an n-type epitaxial layer deposited between the n⁻-type epitaxial layer 33 and the p-type epitaxial layer 34, similarly to the n⁻-type drift region 2b, the effective majority carrier concentration of the n-type current diffusion regions 3 may be reduced by the particle beam irradiation and may be lower than the n-type impurity concentration of the n-type current diffusion regions 3.

The trench structure is configured by the p-type base region 4, the n⁺⁺-type source regions 5, the p⁺⁺-type contact regions 6, and MOS gates configured by the later-described trenches (gate trenches) 7, gate insulating films 8, and gate electrodes 9. The n⁺⁺-type source regions 5 and the p⁺⁺-type contact regions 6 are diffused regions formed in the p-type epitaxial layer 3 by ion implantation. The n⁺⁺-type source regions 5 and the p⁺⁺-type contact regions 6 are selectively provided between the front surface of the semiconductor substrate 30 and the p-type base region 4.

The n⁺⁺-type source regions 5 and the p⁺⁺-type contact regions 6 are in contact with the p-type base region 4 and in contact holes of a later-described interlayer insulating film 11, are exposed at the front surface of the semiconductor substrate 30. Being exposed at the front surface of the semiconductor substrate 30 means being in contact with later-described ohmic electrodes (first electrodes) 13 through the contact holes of the interlayer insulating film 11. The p⁺⁺-type contact regions 6 may be omitted. In an instance in which the p⁺⁺-type contact regions 6 are omitted, instead of the p⁺⁺-type contact regions 6, the p-type base region 4 are exposed at the front surface of the semiconductor substrate 30.

Between the p-type base region 4 and the n⁻-type drift region 2b, the first and the second p⁺-type regions 21, 22 may be provided at positions closer to the n⁺-type drain region 1 than are the bottoms of the trenches 7. The first and the second p⁺-type regions 21, 22 are diffused regions formed in the n⁻-type epitaxial layer 33 (or in an n-type epitaxial layer constituting the n-type current diffusion regions 3) by ion implantation. The first and the second p⁺-type regions 21, 22 have a function of mitigating electric field applied to the bottoms of the trenches 7.

The first p⁺-type regions 21 are provided separate from the p-type base region 4, facing the bottoms of the trenches 7, respectively, in a depth direction. The first p⁺-type regions 21 may be electrically connected to the ohmic electrodes 13 by non-depicted portions. The first p⁺-type regions 21 may, respectively, surround peripheries the bottoms of the trenches 7 and may be exposed at the bottoms of the trenches 7, respectively. Being exposed at the bottoms of the trenches 7 means being in contact with the gate insulating films 8 at the bottoms of the trenches 7. Between an adjacent two of the trenches 7, one of the second p⁺-type regions 22 is provided separate from the first p⁺-type regions 21 and the trenches 7 and in contact with the p-type base region 4.

The trenches 7 penetrate through the n⁺⁺-type source regions 5 and the p-type base region 4 and reach the n-type current diffusion regions 3 (in an instance in which the n-type current diffusion regions 3 are omitted, the n⁻-type drift region 2b). The gate electrodes 9 are provided in the trenches 7, via the gate insulating films 8, respectively. The interlayer insulating film 11 is provided on the front surface of the semiconductor substrate 30 and covers the gate electrodes 9. On entire surfaces between the interlayer insulating film 11 and a later-described front electrode (first electrode) 14, for example, a barrier metal (first electrode) 12 that prevents diffusion of metal atoms from the front electrode 14 to the gate electrodes 9 may be provided.

The ohmic electrodes 13 are provided on the front surface of the semiconductor substrate 30 in the contact holes of the interlayer insulating film 11 and are constituted by a silicide film in ohmic contact with the n⁺⁺-type source regions 5 and the p⁺⁺-type contact regions 6 (in an instance in which the p++-type contact regions 6 are omitted, the p-type base region 4 instead of the p++-type contact regions 6). The ohmic electrodes 13 are electrically connected to the p-type base region 4, the n++-type source regions 5, and the p++-type contact regions 6. The barrier metal 12, the ohmic electrodes 13, and the front electrode 14 function as a source electrode.

In the active region 41, the front electrode 14 is provided on an entire area of the front surface of the semiconductor substrate 30 so as to be embedded in the contact holes of the interlayer insulating film 11. The front electrode 14 is electrically connected to the p-type base region 4, the n++-type source regions 5, and the p++-type contact regions 6, via the ohmic electrodes 13. A back electrode (second electrode) 15 is provided on an entire area of the back surface of the semiconductor substrate 30 (back surface of the n+-type starting substrate 31) and is electrically connected to the n+-type drain region 1. The back electrode 15 functions as a drain electrode.

Figure 4:
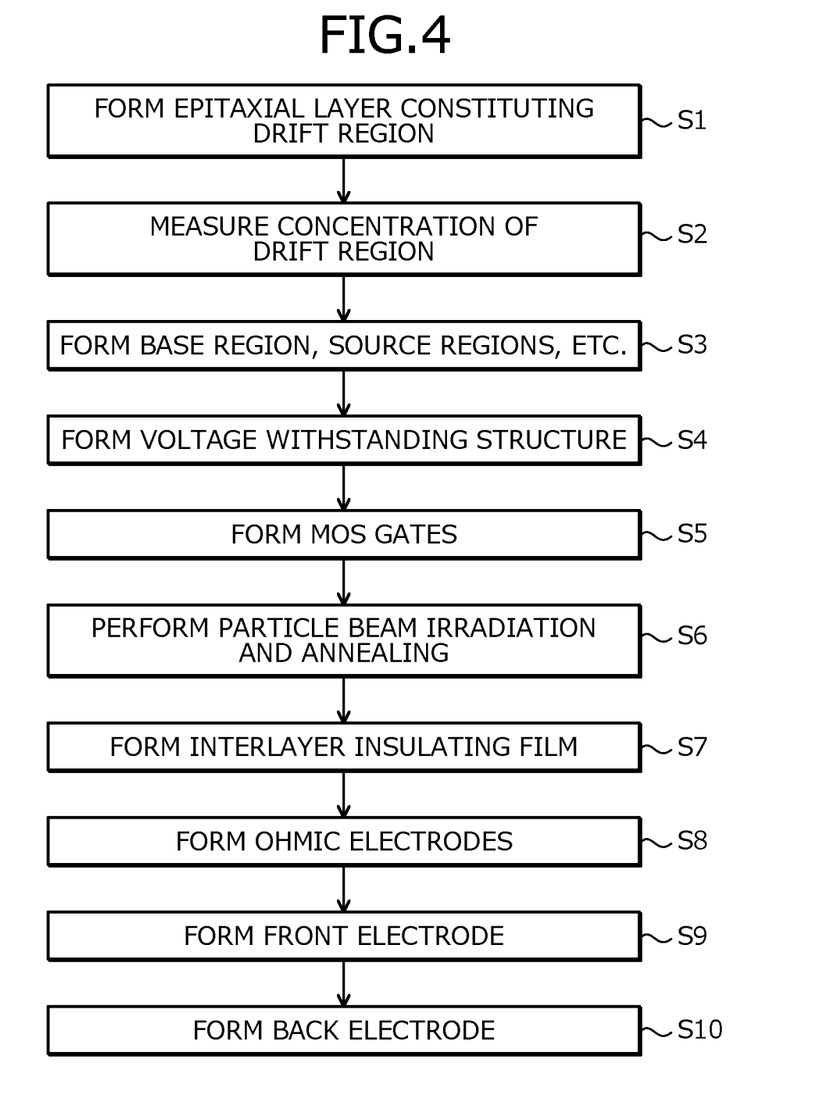
FIG. 4 is a flowchart of an outline of a method of manufacturing the silicon carbide semiconductor device according to the embodiment.

Next, a method of manufacturing the silicon carbide semiconductor device 10 according to the embodiment is described. FIG. 4 is a flowchart of an outline of the method of manufacturing the silicon carbide semiconductor device according to the embodiment. First, the n+-type starting wafer (the semiconductor wafer) containing silicon carbide is prepared. The n+-type starting wafer is a portion constituting the n+-type starting substrate 31 (the n+-type drain region 1) after the semiconductor wafer 50 is diced (refer to FIGS. 1 to 3). Next, the n-type epitaxial layer 32 constituting the n-type buffer region 2a is epitaxially grown on the front surface of the n+-type starting wafer.

Next, the n−-type epitaxial layer 33 doped with an n-type impurity such as nitrogen (N) so that a concentration thereof is the target majority carrier concentration of the n−-type drift region 2b is epitaxially grown on the n-type epitaxial layer 32 (step S1: first process). At this step of the process at step S1, the effective majority carrier concentration of the n−-type drift region 2b is equal to the n-type impurity concentration of the n−-type drift region 2b. Therefore, the n−-type epitaxial layer 33 suffices to be formed so that the n-type impurity concentration thereof becomes equal to the target majority carrier concentration of the n−-type drift region 2b.

Next, the n-type impurity concentration of the n−-type drift region 2b (i.e., the n-type impurity concentration of the n−-type epitaxial layer 33) is measured (step S2: measurement process). During the process at step S2, the surface of the n−-type epitaxial layer 33 is exposed and therefore, the n-type impurity concentration of the n−-type epitaxial layer 33 may be accurately measured. The n-type impurity concentration of the n−-type epitaxial layer 33, for example, may be measured using a general surface analysis method such as surface measurement by secondary ion mass spectrometry (SIMS) in which ions are irradiated and ions generated by collisions of the ions with the solid surface at the molecular/atomic level are detected with a mass spectrometer; measurement of carrier concentration by analysis of the spectral shape of a low frequency region by infrared spectroscopy; or measurement of carrier concentration using capacitance and voltage by mercury CV (capacitance-voltage) measurement.

In the process at step S2, for example, the n-type impurity concentration may be measured at a portion of a non-operating region 53 of the n−-type epitaxial layer 33 (refer to FIG. 1), or any one of the chips 51 may be set as a region for measuring the impurity concentration. The non-operating region 53 is a portion not used as the semiconductor substrate 30, between an end of the semiconductor wafer 50 and the chips 51 that are outermost and closest to the end of the semiconductor wafer 50 (refer to FIG. 2). Alternatively, under the same conditions as those of the process at step S1, a sample for impurity measurement of the n−-type epitaxial layer 33 epitaxially grown may be prepared.

In an instance in which the n-type current diffusion regions 3 and the first and the second p+-type regions 21, 22 are formed, ion implantations for forming these regions suffice to be performed in an arbitrary sequence in the n−-type epitaxial layer 33 after the process at step S1 but before the process at later-described step S3. The epitaxial growth of the n−-type epitaxial layer 33 may be divided into multiple sessions and ion implantation may be performed for each session, thereby forming the n-type current diffusion regions 3 and the first and the second p+-type regions 21, 22 reaching deep positions from an interface between the n−-type epitaxial layer 33 and the p-type epitaxial layer 34.

Next, the p-type epitaxial layer 34 doped with a p-type impurity such as aluminum (Al) is epitaxially grown on the n−-type epitaxial layer 33. By the processes up to here, the semiconductor wafer 50 in which the n-type epitaxial layer 32, the n−-type epitaxial layer 33, and the p-type epitaxial layer 34 are sequentially stacked on the front surface of the n+-type starting wafer (portion constituting the n+-type starting substrate 31) is completed. The semiconductor wafer 50 has a first main surface having the p-type epitaxial layer 34 and assumed as a front surface and a second main surface having the n+-type starting wafer and assumed as a back surface.

Next, in each of the chips 51 of the semiconductor wafer 50, a portion of the p-type epitaxial layer 34 in the edge termination region 42 is removed, whereby in the edge termination region 42, the n−-type epitaxial layer 33 is exposed at the front surface of the semiconductor wafer 50 and the p-type epitaxial layer 34 is left only in the active region 41. Next, by ion implantation, in the active region 41 of each of the chips 51 of the semiconductor wafer 50, the n+-type source regions 5 and the p++-type contact regions 6 are selectively formed in surface regions of the p-type epitaxial layer 34.

A sequence of the process of removing the portion of the p-type epitaxial layer 34 in the edge termination region 42 and the process of forming the n+-type source regions 5 and the p++-type contact regions 6 may be interchanged. A portion of the p-type epitaxial layer 34 free of the n+-type source regions 5 and the p++-type contact regions 6 constitutes the p-type base region 4 (step S3: second and third processes). Next, in the edge termination region 42 of each of the chips 51, a predetermined voltage withstanding structure is formed in a surface region of the n−-type epitaxial layer 33 exposed at the front surface of the semiconductor wafer 50 (step S4).

Next, MOS gates constituted by the trenches 7, the gate insulating films 8, and the gate electrodes 9 are formed by a general method (step S5: fourth and fifth processes). Next, the semiconductor wafer 50 in which the n-type impurity concentration of the n−-type drift region 2b measured in the process at step S2 is higher than the target majority carrier concentration of the n−-type drift region 2b is irradiated with a particle beam (helium, proton, or electron beam) from the front surface or the back surface of the semiconductor wafer 50, by a predetermined irradiation dose (step S6: adjustment process).

Point defects are generated in the n−-type drift region 2b due to the particle beam irradiation at step S6, the point defects being generated at a defect density corresponding to the irradiation dose of the particle beam, and the effective majority carrier concentration of the n⁻-type drift region 2b is adjusted and reduced with respect to the n-type impurity concentration of the n⁻-type drift region 2b. The irradiation dose of the particle beam is set based on the measured value of the n-type impurity concentration of the n⁻-type drift region 2b measured in the process at step S2 so that a threshold of the effective majority carrier concentration of the n⁻-type drift region 2b after the particle beam irradiation approaches the target majority carrier concentration (design value) of the n⁻-type drift region 2b.

The threshold of the effective majority carrier concentration of the n⁻-type drift region 2b is an intermediate value of a variation range of the effective majority carrier concentration of the n⁻-type drift region 2b and corresponds to the target majority carrier concentration of the n⁻-type drift region 2b. At step S6, after the particle beam irradiation, for example, the semiconductor wafer 50 may be heated by annealing (heat treatment) at a temperature in a range from about 350 degrees C. to 400 degrees C. for about 30 minutes to 60 minutes, whereby a portion of the point defects of the n⁻-type drift region 2b is recovered and the threshold of the effective majority carrier concentration of the n⁻-type drift region 2b is adjusted.

By the particle beam irradiation at step S6, an entire area of the n⁻-type epitaxial layer 33 and an entire area of the n⁺-type starting wafer (the n⁺-type starting substrate 31) suffice to irradiated by the particle beam. Further, portions of the semiconductor wafer 50 other than the n⁻-type drift region 2b may be irradiated by the particle beam. For example, in an instance in which an electron beam is irradiated at step S6, from the front surface of the semiconductor wafer 50 to the back surface thereof (or from the back surface to the front surface), the electron beam passes through an entire area of the semiconductor wafer 50 and therefore, the entire area of the semiconductor wafer 50 is irradiated with the electron beam.

As described above, while the n-type impurity concentration of the n⁻-type drift region 2b is not changed by the particle beam irradiation at step S6, the effective carrier concentration of the n⁻-type drift region 2b is reduced corresponding to the irradiation dose of the particle beam. As a result, variation of the effective majority carrier concentration of the n⁻-type drift region 2b may be reduced. A range of a desirable irradiation dose of the particle beam in the particle beam irradiation at step S6 and a lower limit of the effective majority carrier concentration of the n⁻-type drift region 2b by the particle beam irradiation are as follows.

A dose amount of helium irradiation to the n⁻-type drift region 2b suffices to be, for example, at most about $1\times10^{12}/cm^2$. A dose amount of proton irradiation to the n⁻-type drift region 2b suffices to be, for example, at most about $4\times10^{12}/cm^2$. An absorbed dose of electron beam irradiation to the n⁻-type drift region 2b suffices to be, for example, at most about 700 kGy. By these particle beam irradiation doses, it becomes possible to maintain the ON resistance of the silicon carbide semiconductor device 10 and reduce the effective majority carrier concentration of the n⁻-type drift region 2b to, for example, about $6\times10^{15}/cm^2$.

Next, the interlayer insulating film 11 is formed on the front surface of the semiconductor wafer 50 (step S7). After the processes at step S5 but before the process at step S7, in the edge termination region 42 of each of the chips 51, a field oxide film may be formed on the front surface of the semiconductor wafer 50. Next, the interlayer insulating film 11 is selectively removed, thereby forming the contact holes and exposing the n⁺-type source regions 5 and the p⁺⁺-type contact regions 6 in the contact holes. Next, by a general method, the barrier metal 12 covering an entire surface of the interlayer insulating film 11 is formed.

Next, in the contact holes of the interlayer insulating film 11, the ohmic electrodes 13 in ohmic contact with the n⁺-type source regions 5 and the p⁺⁺-type contact regions 6 are formed (step S8: sixth process). Next, the front electrode 14 and the back electrode 15 are formed on the main surfaces of the semiconductor wafer 50, respectively (steps S9, S10: sixth and seventh processes). Thereafter, the semiconductor wafer 50 is cut (diced) into individual semiconductor chips (the semiconductor substrates 30), whereby the silicon carbide semiconductor device 10 depicted in FIGS. 1 to 3 is completed.

In the method of manufacturing the silicon carbide semiconductor device 10 according to the embodiment described, a heating process of heating the semiconductor wafer 50 to at least 400 degrees C. is preferably not be performed after the process (particle beam irradiation and annealing) at step S6. A reason for this is that after the process at step S6, when the semiconductor wafer 50 is heated to a temperature of at least 400 degrees C., the threshold of the effective majority carrier concentration of the n⁻-type drift region 2b adjusted by the process at step S6 will shift from the target majority carrier concentration for the n⁻-type drift region 2b.

In particular, the process (formation of the MOS gates) at step S5 includes heating at a temperature of about 1100 degrees C. Therefore, the process at step S6 suffices to be performed at any timing after step S5. The process at step S6 may be performed to the semiconductor chips (the semiconductor substrates 30) having been cut from the semiconductor wafer 50. Further, in the process at step S1, the n⁻-type epitaxial layer 33 may be formed having an n-type impurity concentration that is higher than the target majority carrier concentration of the n⁻-type drift region 2b.

By forming, in the process at step S1, the n⁻-type epitaxial layer 33 to have an n-type impurity concentration that is higher than the target majority carrier concentration of the n⁻-type drift region 2b, all the semiconductor wafers 50 are subject to the process at step S6. As a result, not only between all the semiconductor chips cut from the same semiconductor wafer 50 but also between all the semiconductor chips manufactured under the same manufacturing conditions, variation of the effective majority carrier concentration of the n⁻-type drift region 2b may be reduced to a greater extent than that by the conventional method (refer to FIG. 8).

As described above, according to the embodiment, the particle beam irradiation is performed with respect to the semiconductor wafer in which the n-type impurity concentration of the n⁻-type drift region is higher than the target majority carrier concentration (design value) of the n⁻-type drift region, at any timing after the formation of the gate electrodes. Point defects at a defect density corresponding to the irradiation dose of the particle beam are generated in the n⁻-type drift region by the particle beam irradiation, whereby the effective majority carrier concentration of the n⁻-type drift region is adjusted and reduced with respect to the n-type impurity concentration of the n⁻-type drift region so as to approach the target majority carrier concentration.

As a result, for the semiconductor wafer in which the effective majority carrier concentration of the n⁻-type drift region varies in an increasing direction from the target majority carrier concentration, variation of the effective majority carrier concentration of the n⁻-type drift region, for example, may be reduced from about +15% for the conventional method (refer to FIG. 8) to about +5%. Further, the irradiation dose of the particle beam to the n⁻-type drift region is adjusted, whereby the effective majority carrier concentration of the n⁻-type drift region may be easily adjusted and a predetermined ON resistance and a predetermined breakdown voltage may be stably obtained.

The effective majority carrier concentration of the n⁻-type drift region 2b after the particle beam irradiation was verified. FIGS. 5, 6, and 7 are characteristics diagrams depicting a relationship between the effective majority carrier concentration of the n⁻-type drift region of an experimental example and particle beam irradiation. For MOSFETs (hereinafter, "experimental examples", refer to FIG. 3) fabricated according to the method of manufacturing the silicon carbide semiconductor device 10 according to the embodiment described above (refer to FIG. 4), FIGS. 5 to 7 depict, respectively, the effective majority carrier concentration of the n⁻-type drift region 2b in instances of irradiation of helium (He), protons, and an electron beam in the process at step S6.

Figure 5:
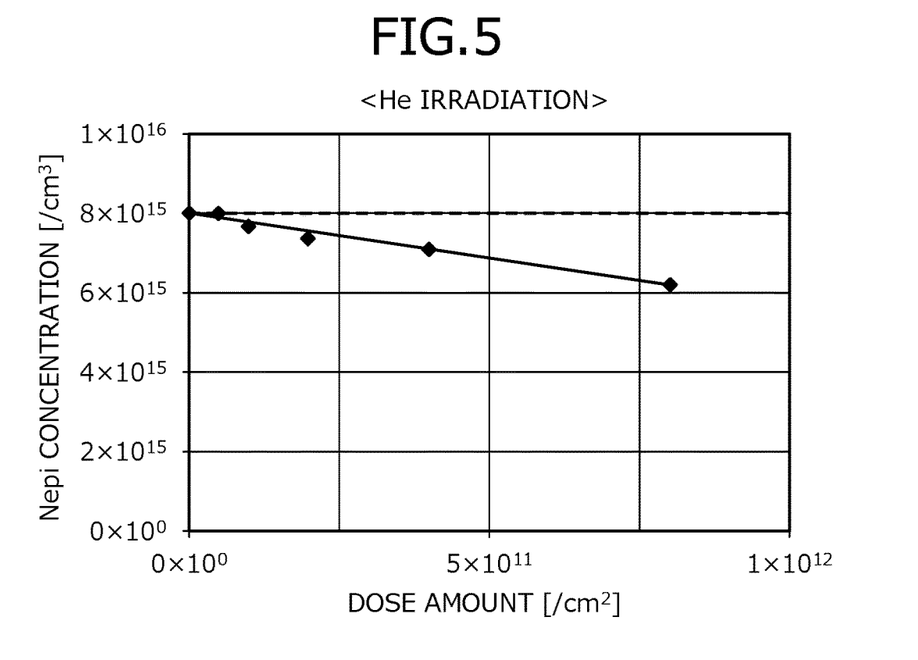
FIG. 5 is a characteristics diagram depicting a relationship between effective majority carrier concentration of an n$^-$-type drift region of an experimental example and particle beam irradiation.
Figure 6:
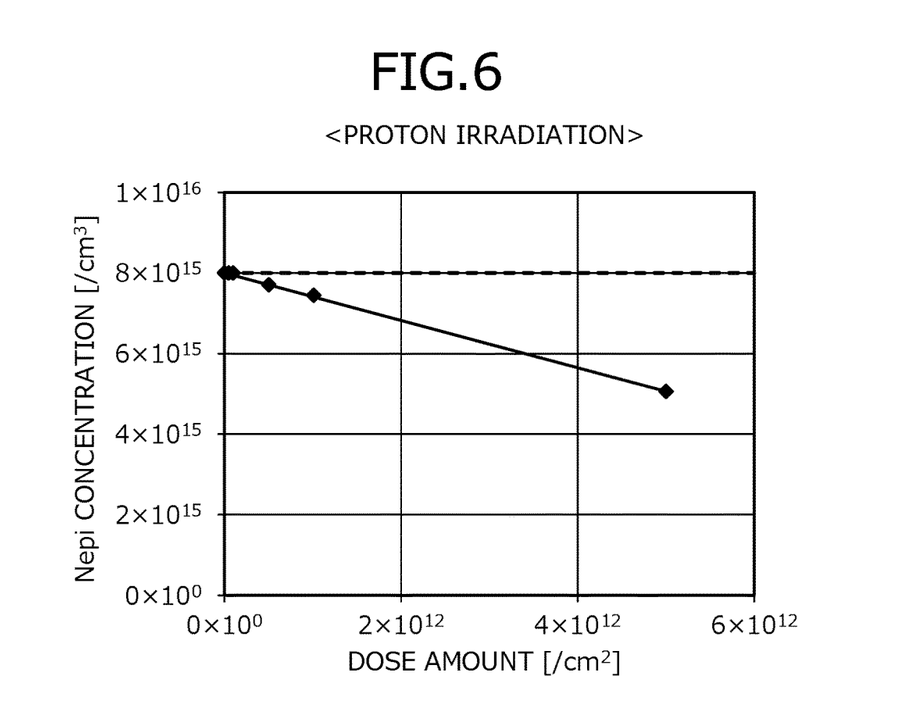
FIG. 6 is a characteristics diagram depicting a relationship between the effective majority carrier concentration of the n$^-$-type drift region of the experimental example and particle beam irradiation.
Figure 7:
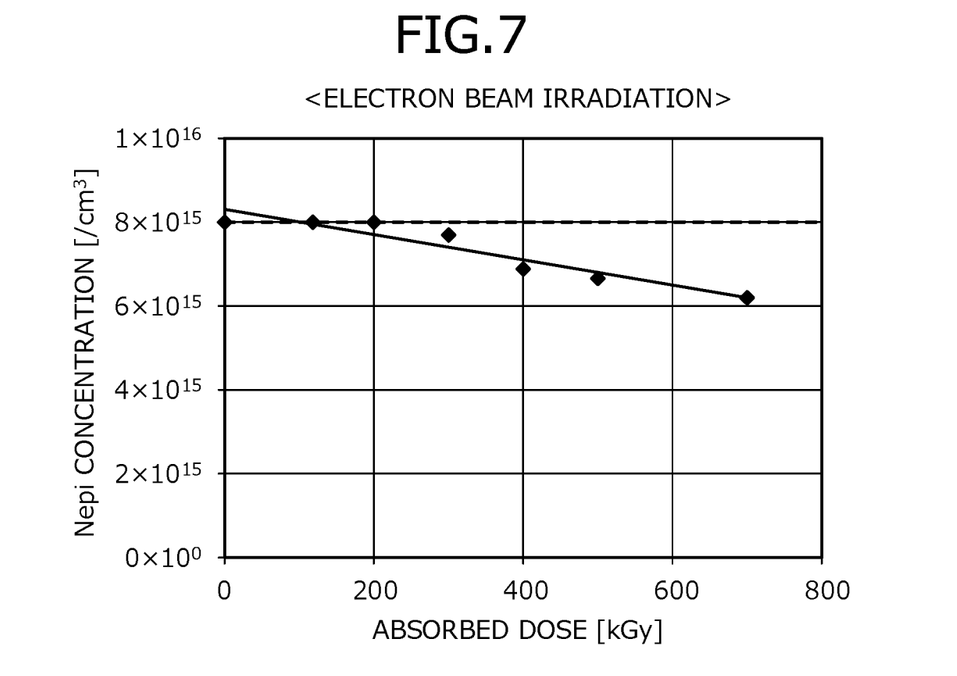
FIG. 7 is a characteristics diagram depicting a relationship between the effective majority carrier concentration of the n$^-$-type drift region of the experimental example and particle beam irradiation.

In FIGS. 5 to 7, the n-type impurity concentration (corresponds to measurement values in process at step S2) of the n⁻-type epitaxial layer 33 constituting the n⁻-type drift region 2b is indicated by a dashed line (reference line: nitrogen concentration $8 \times 10^{15}/cm^3$) while the effective majority carrier concentration of the n⁻-type drift region 2b after the process at step S6 is indicated by a solid line. In FIGS. 5 to 7, a vertical axis indicates the n-type impurity concentration (nitrogen (N) epi-concentration) of the n⁻-type epitaxial layer 33. A horizontal axis indicates helium dose amount, proton dose amount, and electron-beam absorbed dose in FIGS. 5 to 7, respectively.

The effective majority carrier concentration of the n⁻-type drift region 2b is the actual majority carrier concentration of the n⁻-type drift region 2b, calculated using junction capacitance when the depletion layer reaches the n⁺-type drain region 1 and based on a negative correlation with reverse voltage (V) applied to a pn junction of a junction capacitance ($1/C^2$) of a depletion layer that spreads from the pn junction between the p-type base region 4 and the n⁻-type drift region 2b measured by CV (capacitance-voltage) measurement. In the examples of FIGS. 5 to 7, the n-type current diffusion regions 3 and the first and the second p⁺-type regions 21, 22 are omitted.

In each of the examples in FIGS. 5 to 7, it was confirmed that the greater the irradiation dose of the particle beam is increased, the greater the actual majority carrier concentration of the n⁻-type drift region 2b decreases, whereby the actual majority carrier concentration of the n⁻-type drift region 2b may be adjusted by the particle beam irradiation. Further, it was confirmed that the n-type impurity concentration of the n⁻-type drift region 2b does not change after the particle beam irradiation, whereby the greater the irradiation dose of the particle beam increases, the smaller the ratio of the actual majority carrier concentration of the n⁻-type drift region 2b to the n-type impurity concentration of the n⁻-type drift region 2b becomes.

In the foregoing, the present invention is not limited to the embodiments described above and various modifications within a range not departing from the spirit of the invention are possible. For example, in the described embodiments, while a MOSFET is described as an example, the present invention is applicable to silicon carbide semiconductor devices such as insulated gate bipolar transistors (IGBTs) and p-intrinsic-n (pin) diodes having an n⁻-type drift region constituted by an epitaxial layer.

The silicon carbide semiconductor device and the method of manufacturing a silicon carbide semiconductor device according to the present invention achieve an effect in that variation of the effective majority carrier concentration of the n⁻-type drift region may be reduced, whereby a predetermined ON resistance and a predetermined breakdown voltage may be obtained stably.

As described above, the silicon carbide semiconductor device and the method of manufacturing a silicon carbide semiconductor device according to the present invention are useful for power semiconductor devices used in power converting equipment and power source devices used in various types of industrial machines and are particularly suitable for MOSFETs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a starting substrate containing silicon carbide and having a first surface and a second surface opposite to each other;
   a first-conductivity-type epitaxial layer provided on the first surface of the starting substrate;
   a second-conductivity-type epitaxial layer provided on the first-conductivity-type epitaxial layer; and
   a pn junction through which a main current passes, the pn junction being between the second-conductivity-type epitaxial layer and the first-conductivity-type epitaxial layer, wherein
   the first-conductivity-type epitaxial layer contains a plurality of point defects at a defect density corresponding to an irradiation dose of a particle beam, the first-conductivity-type epitaxial layer having an effective majority carrier concentration that is lower than a concentration of a first-conductivity-type impurity of the first-conductivity-type epitaxial layer.

2. The silicon carbide semiconductor device according to claim 1, wherein
   the effective majority carrier concentration of the first-conductivity-type epitaxial layer is at least 70% but less than 100% of the concentration of the first-conductivity-type impurity of the first-conductivity-type epitaxial layer.

3. The silicon carbide semiconductor device according to claim 1, wherein
   the effective majority carrier concentration of the first-conductivity-type epitaxial layer is within 10% lower than the concentration of the first-conductivity-type impurity of the first-conductivity-type epitaxial layer.

4. The silicon carbide semiconductor device according to claim 1, wherein
   the particle beam contains helium, protons or electrons.

5. The silicon carbide semiconductor device according to claim 1, wherein
   an entire area of the first-conductivity-type epitaxial layer and an entire area of the starting substrate contain the point defects.

6. The silicon carbide semiconductor device according to claim 1, further comprising:
   a plurality of first-conductivity-type regions provided in the second-conductivity-type epitaxial layer;

a second-conductivity-type region that is a portion of the second-conductivity-type epitaxial layer free of the first-conductivity-type regions;

a gate insulating film provided in contact with a region of the second-conductivity-type region between one of the first-conductivity-type regions and the first-conductivity-type epitaxial layer;

a gate electrode provided facing the second-conductivity-type region with the gate insulating film intervening therebetween;

a first electrode electrically connected to the first-conductivity-type regions and the second-conductivity-type region; and a second electrode provided on the second surface of the starting substrate.

7. A method of manufacturing the silicon carbide semiconductor device according to claim 1, the method comprising:

preparing, as a first process, the starting substrate containing silicon carbide and epitaxially growing the first-conductivity-type epitaxial layer on the first surface of the starting substrate;

epitaxially growing the second-conductivity-type epitaxial layer on the first-conductivity-type epitaxial layer as a second process;

forming, as a third process, a plurality of first-conductivity-type regions in the second-conductivity-type epitaxial layer, a portion of the second-conductivity-type epitaxial layer free of the first-conductivity-type regions constituting a second-conductivity-type region;

forming a gate insulating film in contact with a region of the second-conductivity-type region as a fourth process, the region being between one of the first-conductivity-type regions and the first-conductivity-type epitaxial layer;

forming a gate electrode facing the second-conductivity-type region with the gate insulating film intervening therebetween as a fifth process;

forming a first electrode electrically connected to the first-conductivity-type regions and the second-conductivity-type region as a sixth process;

forming a second electrode on the second surface of the starting substrate as a seventh process;

measuring a concentration of a first-conductivity-type impurity of the first-conductivity-type epitaxial layer as a measurement process, the measurement process being performed after the first process but before the second process; and when the concentration of the first-conductivity-type impurity of the first-conductivity-type epitaxial layer measured by the measurement process is higher than a design value, irradiating, as an adjustment process, the first-conductivity-type epitaxial layer with a particle beam, and reducing an effective majority carrier concentration of the first-conductivity-type epitaxial layer with respect to the concentration of the first-conductivity-type impurity of the first-conductivity-type epitaxial layer, to approach the design value.

8. The method according to claim 7, wherein
in the adjustment process, the effective majority carrier concentration of the first-conductivity-type epitaxial layer is set to be at least 70% but less than 100% of the concentration of the first-conductivity-type impurity of the first-conductivity-type epitaxial layer.

9. The method according to claim 7, wherein
in the adjustment process, the effective majority carrier concentration of the first-conductivity-type epitaxial layer is within 10% lower than the concentration of the first-conductivity-type impurity of the first-conductivity-type epitaxial layer.

10. The method according to claim 7, wherein
in the adjustment process, the particle beam contains helium, protons or electrons.

11. The method according to claim 7, wherein
the adjustment process includes performing a heat treatment at a temperature in a range from 350 degrees C. to 400 degrees C. after irradiating the first-conductivity-type epitaxial layer with the particle beam.

12. The method according to claim 11, wherein
in the adjustment process, the heat treatment is performed for a length of time in a range from 30 minutes to 60 minutes.

13. The method according to claim 11, wherein
the method is free of another heat treatment of a temperature of at least 400 degrees C. after the heat treatment of the adjustment process.

14. A method of manufacturing the silicon carbide semiconductor device according to claim 1, the method comprising:

preparing, as a first process, the starting substrate containing silicon carbide and epitaxially growing the first-conductivity-type epitaxial layer on the first surface of the starting substrate, the first-conductivity-type epitaxial layer having a concentration of a first-conductivity-type impurity higher than a design value;

epitaxially growing the second-conductivity-type epitaxial layer on the first-conductivity-type epitaxial layer as a second process;

forming, as a third process, a plurality of first-conductivity-type regions in the second-conductivity-type epitaxial layer, a portion of the second-conductivity-type epitaxial layer free of the first-conductivity-type regions constituting a second-conductivity-type region;

forming a gate insulating film in contact with a region of the second-conductivity-type region as a fourth process, the region being between one of the first-conductivity-type regions and the first-conductivity-type epitaxial layer;

forming a gate electrode facing the second-conductivity-type region with the gate insulating film intervening therebetween as a fifth process;

forming a first electrode electrically connected to the first-conductivity-type regions and the second-conductivity-type region as a sixth process;

forming a second electrode on the second surface of the starting substrate as a seventh process; and irradiating, as an adjustment process, the first-conductivity-type epitaxial layer with a particle beam, and reducing an effective majority carrier concentration of the first-conductivity-type epitaxial layer with respect to the concentration of the first-conductivity-type impurity of the first-conductivity-type epitaxial layer, to approach the design value.

15. The method according to claim 14 wherein
in the adjustment process, the effective majority carrier concentration of the first-conductivity-type epitaxial layer is set to be at least 70% but less than 100% of the concentration of the first-conductivity-type impurity of the first-conductivity-type epitaxial layer.

16. The method according to claim 14, wherein
in the adjustment process, the effective majority carrier concentration of the first-conductivity-type epitaxial layer is within 10% lower than the concentration of the first-conductivity-type impurity of the first-conductivity-type epitaxial layer.

17. The method according to claim 14, wherein in the adjustment process, the particle beam contains helium, protons or electrons.

18. The method according to claim 14, wherein the adjustment process includes performing a heat treatment at a temperature in a range from 350 degrees C. to 400 degrees C. after irradiating the first-conductivity-type epitaxial layer with the particle beam.

19. The method according to claim 18, wherein in the adjustment process, the heat treatment is performed for a length of time in a range from 30 minutes to 60 minutes.

20. The method according to claim 18, wherein the method is free of another heat treatment of a temperature of at least 400 degrees C. after the heat treatment of the adjustment process.

* * * * *